(12) United States Patent
Shin et al.

(10) Patent No.: US 8,572,546 B2
(45) Date of Patent: Oct. 29, 2013

(54) METHODS OF MODELING A TRANSISTOR AND APPARATUS USED THEREIN

(75) Inventors: Jaeheon Shin, Daejeon (KR); Woo-Seok Cheong, Daejeon (KR); Chi-Sun Hwang, Daejeon (KR); Sung Mook Chung, Gyeonggi-do (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/371,487

(22) Filed: Feb. 13, 2012

(65) Prior Publication Data

US 2012/0297351 A1 Nov. 22, 2012

(30) Foreign Application Priority Data

May 20, 2011 (KR) .................. 10-2011-0048064

(51) Int. Cl.
*G06F 17/50* (2006.01)
(52) U.S. Cl.
USPC .......................... 716/136; 716/106
(58) Field of Classification Search
USPC .................................. 716/106, 136
See application file for complete search history.

(56) References Cited

U.S. PATENT DOCUMENTS

| | | | |
|---|---|---|---|
| 7,171,346 B1 * | 1/2007 | Recker et al. .............. | 703/14 |
| 8,095,343 B2 | 1/2012 | Shin et al. | |
| 2003/0220779 A1 * | 11/2003 | Chen et al. ................ | 703/14 |
| 2009/0132974 A1 * | 5/2009 | Yoshimoto et al. ......... | 716/4 |

FOREIGN PATENT DOCUMENTS

KR 10-2009-0065246 A 6/2009

OTHER PUBLICATIONS

R.L. Hoffman, "A closed-form DC model for long-channel thin-film transistors with gate voltage-dependent mobility characteristics", Solid-State Electronics, vol. 49, pp. 648-653, Feb. 2, 2005.
L. Colalongo, "A new analytical model for amorphous-silicon thin-film transistors including tail and deep states", Solid-State Electronics, vol. 45, pp. 1525-1530, Apr. 25, 2001.
T. Leroux, "Static and dynamic analysis of amorphous-silicon field-effect transistors", Solid-State Electronics, vol. 29, No. 1, pp. 47-58, May 12, 1985.
Shur and M. Hack, "Physics of amorphous silicon based alloy fieldeffect transistors", J. Appl. Phys. vol. 55, No. 10, pp. 3831-3842, May 15, 1984.
Michael S. Shur et al., "SPICE Models for Amorphous Silicon and Polysilicon Thin Film Transistors", J. Electrochem. Soc., vol. 144, No. 8, pp. 2833-2839, Aug. 1997.

(Continued)

*Primary Examiner* — Jack Chiang
*Assistant Examiner* — Brandon Bowers
(74) *Attorney, Agent, or Firm* — Rabin & Berdo, P.C.

(57) ABSTRACT

Methods of modeling a transistor are provided. The method includes the steps of (a) extracting reference mobility values of a channel layer of a transistor including a gate electrode, a source region and a drain region using a reference gate voltage, a reference drain current and a reference drain voltage, (b) fitting a mobility function including model parameters on the reference mobility values to extract the model parameters, and (c) putting the extracted model parameters into a drain current modeling function to calculate a drain current flowing through the channel layer between the drain region and the source region under a bias condition defined by an arbitrary gate voltage applied to the gate electrode and an arbitrary drain voltage applied to the drain region. Related apparatuses are also provided.

15 Claims, 9 Drawing Sheets

(56) References Cited

OTHER PUBLICATIONS

Mark D. Jacunski et al., "Threshold Voltage, Field Effect Mobility, and Gate-to-Channel Capacitance in Polysilicon TFT's", IEEE Transactions on Electron Devices, vol. 43, No. 9, pp. 1433-1440, Sep. 1996.

R. L. Hoffman, "ZnO-channel thin-film transistors: Channel mobility", Journal of Applied Physics, vol. 95, No. 10, pp. 5813-5819, May 15, 2004.

* cited by examiner

METHODS OF MODELING A TRANSISTOR AND APPARATUS USED THEREIN

CROSS-REFERENCE TO RELATED APPLICATIONS

This U.S. non-provisional patent application claims priority under 35 U.S.C. §119 to Korean Patent Application No. 10-2011-0048064, filed on May 20, 2011, in the Korean Intellectual Property Office, the entire contents of which are hereby incorporated by reference herein.

BACKGROUND

1. Technical Field

The present disclosure herein relates to methods of modeling a transistor and apparatus used therein.

2. Description of Related Art

Semiconductor devices are widely used in various industrial areas such as electronic systems, automobiles and/or vessels because of light weight, small size, multi-function and/or low fabrication cost thereof. Field effect transistors (hereinafter, referred to as transistors) are important elements that constitute the semiconductor devices. In general, each of the transistors may include a gate electrode, a source region and a drain region. The source region and the drain region may be disposed in a semiconductor substrate and may be spaced apart from each other, and the gate electrode may be disposed on a channel region between the source region and the drain region. The source and drain regions may be formed by injecting dopant ions into the semiconductor substrate, and the gate electrode may be insulated from the channel region by a gate insulation layer. These transistors are widely used as switching elements constituting integrated circuits of the semiconductor device or single elements constituting logic circuits of the semiconductor device.

High reliable transistors have been increasingly demanded with the development of electronic industry. Accordingly, novel methods of modeling the transistors have been more required to improve the reliability of the transistors.

SUMMARY

Exemplary embodiments are directed to methods of modeling a high reliable transistor and apparatus used therein According to some embodiments, a method of modeling a transistor includes the steps of (a) extracting reference mobility values of a channel layer of a transistor including a gate electrode, a source region and a drain region using a reference gate voltage, a reference drain current and a reference drain voltage, (b) fitting a mobility function including model parameters on the reference mobility values to extract the model parameters, and (c) putting the extracted model parameters into a drain current modeling function to calculate a drain current flowing through the channel layer between the drain region and the source region under a bias condition defined by an arbitrary gate voltage applied to the gate electrode and an arbitrary drain voltage applied to the drain region.

In an embodiment, the drain current modeling function may be expressed by the following equation, $$I_d = \frac{CW}{L} \int_0^{V_d} \left( \frac{1}{K_b(V_g - V_{on} - V_y)^\beta} + \frac{1}{K_a(V_g - V_{on} - V_y)^\alpha} \right)^{-1} \times (V_g - V_{on} - V_y) dV_y$$

wherein, "Id" denotes the drain current, "Vg" denotes the arbitrary gate voltage, "Vd" denotes the arbitrary drain voltage, "L" denotes a channel length of the transistor, "W" denotes a channel width of the transistor, and "C" denotes a gate capacitance between the channel layer and the gate electrode.

In an embodiment, the method may further include additionally and repeatedly performing the step of extracting the reference mobility values and the step of extracting the model parameters against different channel layers at least once to extract a plurality of model parameter data sets, and storing a memory unit with the plurality of model parameter data sets.

In an embodiment, the method may further include selecting one set of the plurality of model parameter data sets. The drain current may be calculated using the selected of model parameter data set.

In an embodiment, the reference mobility values may be extracted using the following equation, $$\mu_r = \frac{L}{W} \frac{I_r}{C(V_{gr} - V_{on})V_{dr}}$$

wherein, "$\mu_r$" denotes the reference mobility, "L" denotes a channel length of the transistor. "W" denotes a channel width of the transistor, "Ir" denotes the reference drain current, "C" denotes a gate capacitance between the channel layer and the gate electrode, "Vgr" denotes the reference gate voltage, "Von" denotes a turn on voltage of the transistor, and "Vdr" denotes the reference drain voltage.

In an embodiment, the reference drain voltage may be within the range of about 0.001 Volts to about 1.0 Volts.

In an embodiment, the method may further include applying the reference gate voltage and the reference drain voltage to the gate electrode and the drain region respectively to measure the reference drain current flowing through the channel layer between the drain region and the source region, prior to extraction of the reference mobility values.

In an embodiment, the transistor may include a thin film transistor.

In an embodiment, the channel layer may have an amorphous structure.

In an embodiment, the channel layer may include an organic semiconductor material or an oxide semiconductor material.

According to further embodiments, an apparatus used in modeling a transistor includes a reference mobility extraction unit, a fitting unit, and a drain current modeling unit. The reference mobility extraction unit extracts reference mobility values of a channel layer of the transistor including a gate electrode, a source region and a drain region using a reference gate voltage applied to the gate electrode and a reference drain current flowing through the channel layer in response to the reference gate voltage. The fitting unit extracts model parameters by fitting a mobility function of the model parameters on the reference mobility values. The drain current modeling unit calculates a drain current flowing through the channel layer by putting an arbitrary gate voltage applied to the gate electrode, an arbitrary drain voltage applied to the drain region and the model parameters into a drain current modeling function.

In an embodiment, the drain current modeling unit may additionally put a channel length of the transistor, a channel width of the transistor, a gate capacitance between the channel layer and the gate electrode, an arbitrary drain voltage applied to the drain region, and a turn on voltage of the transistor into the drain current modeling function.

In an embodiment, the fitting unit may extract the model parameters by fitting a mobility function on the reference mobility values.

The mobility function may be expressed by the following equation, $$\mu = \left( \frac{1}{K_b (V_{gate} - V_{on})^\beta} + \frac{1}{K_a (V_{gate} - V_{on})^\alpha} \right)^{-1}$$

wherein, "Ka", "Kb", "α" and "β" denote the model parameters, "Vgate" denotes the reference gate voltage corresponding to a gate voltage applied to the gate electrode, "Von" denotes a turn on voltage of the transistor, and "μ" denotes a mobility of the channel layer that is calculated using the model parameters, the reference gate voltage and the turn on voltage.

The drain current modeling function may be expressed by the following equation, $$I_d = \frac{CW}{L} \int_0^{V_d} \left( \frac{1}{K_b (V_g - V_{on} - V_y)^\beta} + \frac{1}{K_a (V_g - V_{on} - V_y)^\alpha} \right)^{-1} \times (V_g - V_{on} - V_y) dV_y$$

wherein, "Id" denotes the drain current, "Vg" denotes the arbitrary gate voltage, "Vd" denotes the arbitrary drain voltage, "L" denotes a channel length of the transistor, "W" denotes a channel width of the transistor, "C" denotes a gate capacitance between the channel layer and the gate electrode, and "Von" denotes the turn on voltage of the transistor.

In an embodiment, the number of the transistor may be two or more, the channel layers of the plurality of transistors may be formed of different material layers from each other, and the reference mobility extraction unit and the fitting unit may extract a plurality of model parameter sets including the model parameters.

In an embodiment, the apparatus may further include a memory unit storing the plurality of model parameter sets therein.

BRIEF DESCRIPTION OF THE DRAWINGS

The above and other features and advantages of the disclosure will become more apparent in view of the attached drawings and accompanying detailed description.

DETAILED DESCRIPTION OF THE EMBODIMENTS

Figure 1:
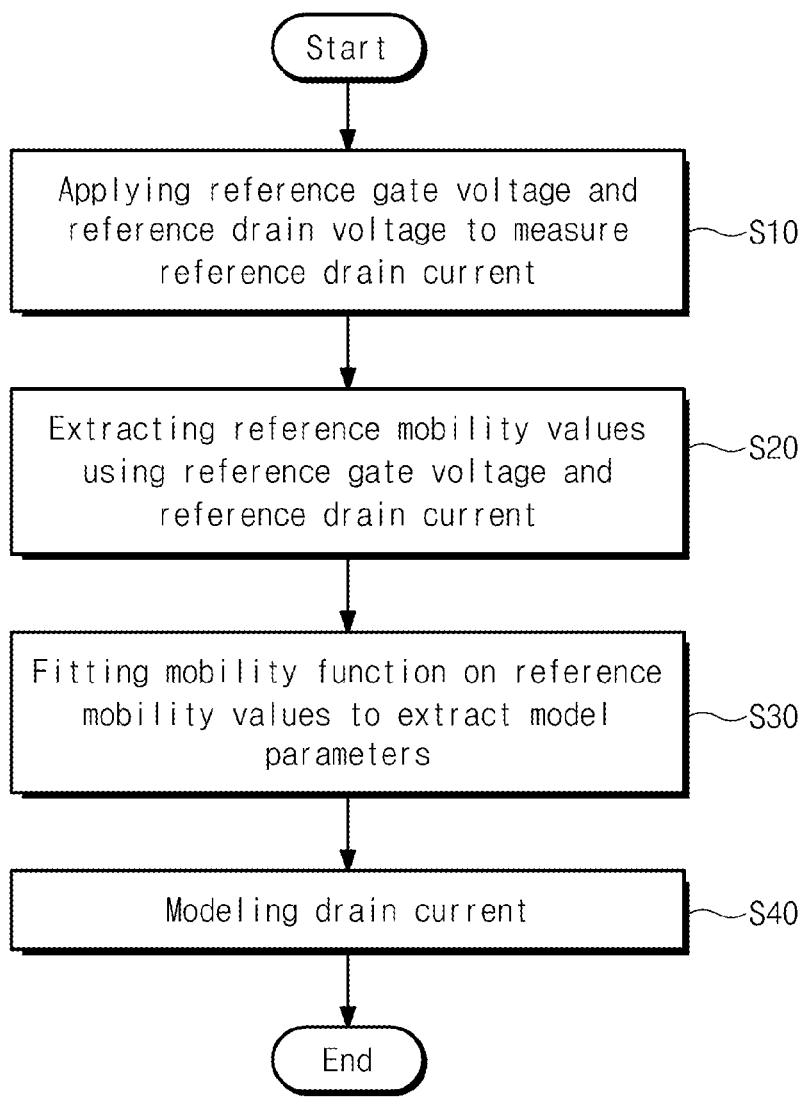
FIG. 1 is a flowchart illustrating a method of modeling a transistor according to an embodiment.

The advantages and features of the inventive subject matter and methods of achieving them will be apparent from the following exemplary embodiments that will be described in more detail with reference to the accompanying drawings. It should be noted, however, that the inventive subject matter is not limited to the following exemplary embodiments, and may be implemented in various forms. Rather, these exemplary embodiments are provided so that this disclosure will be thorough and complete, and will convey the scope of the disclosure to those skilled in the art.

It will be understood that when an element such as a layer, region or substrate is referred to as being "on" another element, it can be directly on the other, element or intervening elements may be present. In contrast, the term "directly" means that there are no intervening elements. In the drawings, the sizes and relative sizes of layers and regions may be exaggerated for clarity. It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive subject matter explained and illustrated herein include their complementary counterparts.

As used herein the term "and/or" includes any and all combinations of one or more of the associated listed items. The same reference numerals or the same reference designators denote the same elements throughout the specification.

FIG. 1 is a flowchart illustrating a method of modeling a transistor according to an embodiment.

Referring to FIG. 1, a transistor for modeling may be provided. The transistor may be a thin film transistor formed on a substrate. The substrate may be a glass substrate or a plastic substrate. The substrate may be a flexible substrate. The transistor may include a gate electrode, a gate insulation layer, a source region, a drain region and a channel layer.

The channel layer may overlap with the gate electrode in a plan view. The gate insulation layer may be disposed between the channel layer and the gate electrode. According to some embodiments, the channel layer may be disposed above the gate electrode. Alternatively, the channel layer may be disposed below the gate electrode. When a voltage applied to the gate electrode is equal to or higher than a turn on voltage of the transistor, an inversion channel region may be formed in the channel layer.

The channel layer may include a semiconductor material. For example, the channel layer may include an organic semiconductor material or an oxide semiconductor material (e.g., a zinc oxide (ZnO) material or an indium-gallium-zinc oxide (IGZO) material). The channel layer may have an amorphous structure.

In a step S10, a reference gate voltage and a reference drain voltage are applied to the gate electrode of the transistor and the drain region of the transistor respectively, thereby measuring a reference drain current. While the reference drain current is measured, the source region may be grounded. The reference drain current may flows from the drain region toward the source region through the channel layer. The reference drain voltage may be within the range of about 0.001 Volts to about 1.0 Volts. If the reference drain voltage is fixed to have a constant value and the reference gate voltage varies, the reference drain current may also vary.

In a step S20, reference mobility values of the channel layer may be extracted using the reference gate voltages and the measured reference drain current values. Each of the reference mobility values may correspond to an average mobility of the channel layer. The reference mobility values may be extracted using the following equation 1. The equation 1:

$$\mu_r = \frac{L}{W} \frac{I_r}{C(V_{gr} - V_{on})V_{dr}} \quad \text{(Equation 1)}$$

In the equation 1, "$\mu_r$" denotes the reference mobility of the transistor, and "L" denotes a channel length of the transistor. Further, "W" denotes a channel width of the transistor, and "Ir" denotes the reference drain current. Moreover, "C" denotes a gate capacitance between the channel layer and the gate electrode, and "Vgr" denotes the reference gate voltage. In addition, "Von" denotes a turn on voltage, and "Vdr" denotes the reference drain voltage.

In a step S30, a mobility function of the reference mobility and model parameters may be fitted on the reference mobility values extracted using the equation 1. As a result, the model parameters may be extracted.

When the transistor is a thin film transistor and the channel layer of the transistor has an amorphous structure, the mobility function may be divided into a tail state model function and a deep state model function. The tail state model function may be applied to the transistor when a Fermi level of the channel layer overlaps with a tail state adjacent to a conduction band of the channel layer, and the deep state model function may be applied to the transistor when a Fermi level of the channel layer overlap with a deep state around a mid gap between a conduction band and a valence band of the channel layer.

When the Fermi level of the channel layer overlaps with the deep state of the channel layer, the mobility of the channel layer may be proportional to a value expressed by (Vgate−Vfb)$^\beta$. Here, "Vgate" denotes a gate voltage applied to the gate electrode of the transistor, and "Vfb" denotes a flat band voltage of the transistor. Further, "$\beta$" denotes a parameter that relates to a temperature characteristic at the deep state.

When the Fermi level of the channel layer overlaps with the tail state of the channel layer, the mobility of the channel layer may be proportional to a value expressed by (Vgate−Vt)$^\alpha$.

Here, "Vt" denotes a threshold voltage of the transistor, and "$\alpha$" denotes a parameter that relates to a temperature characteristic at the tail state.

The flat band voltage Vfb may be substantially equal to the turn on voltage of the transistor. In a thin film transistor employing an oxide semiconductor material as the channel layer, the threshold voltage Vt of the thin film transistor may be approximately equal to the turn on voltage when the gate voltage applied to the gate electrode is greater than a certain level.

If the gate voltage has a relatively low level, a relatively weak electric field may be applied to the channel layer. Accordingly, the mobility of the channel layer may be proportional to a value of (Vgate−Von)$^\beta$. Alternatively, if the gate voltage has a relatively high level, a relatively strong electric field may be applied to the channel layer. Thus, the mobility of the channel layer may be proportional to a value of (Vgate−Von)$^\alpha$.

The mobility function used in the step S30 may be expressed by a harmonic mean of the values of (Vgate−Von)$^\beta$ and (Vgate−Von)$^\alpha$, as described in the following equation 2.

$$\mu = \left( \frac{1}{K_b(V_{gate} - V_{on})^\beta} + \frac{1}{K_a(V_{gate} - V_{on})^\alpha} \right)^{-1} \quad \text{(Equation 2)}$$

Wherein, "Ka" and "Kb" are proportional factors.

The mobility function has the model parameters "Ka", "Kb", "$\alpha$" and "$\beta$". In the event that the equation 2 is fitted on the reference mobility values, the gate voltage Vgate in the equation 2 may correspond to the reference gate voltage Vgr. In the equation 2, "$\mu$" may correspond to a mobility of the channel layer that is calculated using the model parameters, the reference gate voltage and the turn on voltage of the transistor. The model parameters "Ka", "Kb", "$\alpha$" and "$\beta$" can be obtained by fitting the equation 2 on the reference mobility values extracted in the step S20.

In a step S40, the model parameter values "Ka", "Kb", "$\alpha$" and "$\beta$" obtained in the step S30 may be put into a drain current modeling function, thereby calculating a drain current that flows through the channel layer under a bias condition defined by an arbitrary gate voltage and an arbitrary drain voltage.

The drain current modeling function may be expressed by the following equation 3.

$$\text{(Equation 3)}$$

$$I_d = \frac{CW}{L} \int_0^{V_d} \mu(V_g - V_y) \times (V_g - V_{on} - V_y) dV_y$$
$$= \frac{CW}{L} \int_0^{V_d} \left( \frac{1}{K_b(V_g - V_{on} - V_y)^\beta} + \frac{1}{K_a(V_g - V_{on} - V_y)^\alpha} \right)^{-1} \times$$
$$(V_g - V_{on} - V_y) dV_y$$

Wherein, "Id" denotes the drain current flows through the channel layer, "Vg" denotes the arbitrary gate voltage applied to the gate electrode, and "Vd" denotes the arbitrary drain voltage applied to the drain region.

Figure 2:
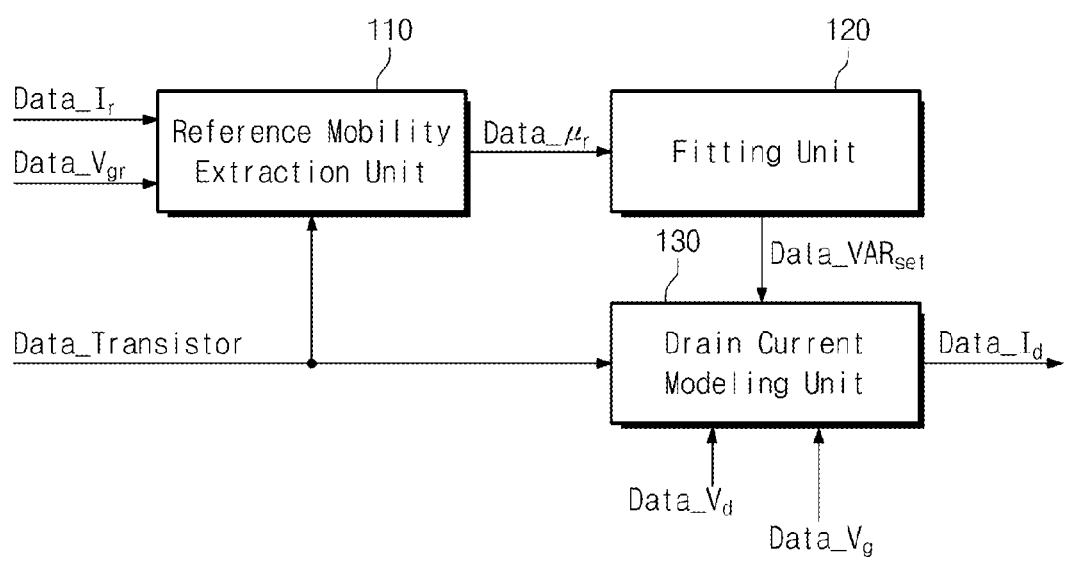
FIG. 2 is a block diagram illustrating an apparatus used in modeling a transistor according to an embodiment.

Now, a modeling apparatus of a transistor according to an embodiment will be described. FIG. 2 is a block diagram illustrating an apparatus used in modeling a transistor according to an embodiment.

Referring to FIG. 2, a modeling apparatus according to an embodiment may include a reference mobility extraction unit 110, a fitting unit 120 and a drain current modeling unit 130.

The reference mobility extraction unit 110 may receive reference gate voltage data (Data_Vgr), reference drain current data (Data_Ir), and transistor data (Data_Transistor) to extract reference mobility data (Data_$\mu_r$). The extracted reference mobility data (Data_$\mu_r$) may be output from the reference mobility extraction unit 110.

The reference gate voltage data (Data_Vgr) may include data that relate to reference gate voltage levels applied to the gate electrode of the transistor. The reference drain current data (Data_Ir) may include data that relate to reference drain current values flowing through the channel layer between the drain region and the source region of the transistor. The reference drain current values of the reference drain current data (Data_Ir) may be measured by applying the reference gate voltage levels of the reference gate voltage data (Data_Vgr) to the gate electrode, as described with reference to the step S10.

The transistor data (Data_Transistor) may include a channel length L, a channel width W, a gate capacitance C, reference drain voltages, and a turn on voltage of the transistor.

The reference mobility data (Data_$\mu_r$) may include data that relate to mobility values of the channel layer according to voltages applied to the gate electrode.

The reference mobility extraction unit 110 may extract the reference mobility values of the reference mobility data (Data_$\mu_r$) using the reference gate voltage data (Data_Vgr), the reference drain current data (Data_Ir), the transistor data (Data_Transistor), and the equation 1 and may transmit the extracted reference mobility data (Data_$\mu_r$) to the fitting unit 120.

The fitting unit 120 may be configured to receive the reference mobility data (Data_$\mu_r$) and to output a model parameter data set (Data_VARset). The fitting unit 120 may extract the model parameters "Ka", "Kb", "$\alpha$" and "$\beta$" by fitting the equation 2 described in the step 30 on the reference mobility values of the reference mobility data (Data_$\mu_r$). The model parameter data set (Data_VARset) including the model parameters "Ka", "Kb", "$\alpha$" and "$\beta$" may be transmitted to the drain current modeling unit 130.

The drain current modeling unit 130 may be configured to receive model parameter data set (Data_VARset), drain voltage data (Data_Vd), gate voltage data (Data_Vg) and the transistor data (Data_Transistor) and to output drain current data (Data_Id) of the transistor. The drain current modeling unit 130 may put the model parameters of the model parameter data set (Data_VARset) and the data of the transistor data (Data_Transistor) into the equation 3 described with reference to the step S40, thereby calculating drain current values that flows through the channel layer under bias conditions defined by arbitrary gate voltages of the gate voltage data (Data_Vg) and arbitrary drain voltages of the drain voltage data (Data_Vd).

Figure 3:
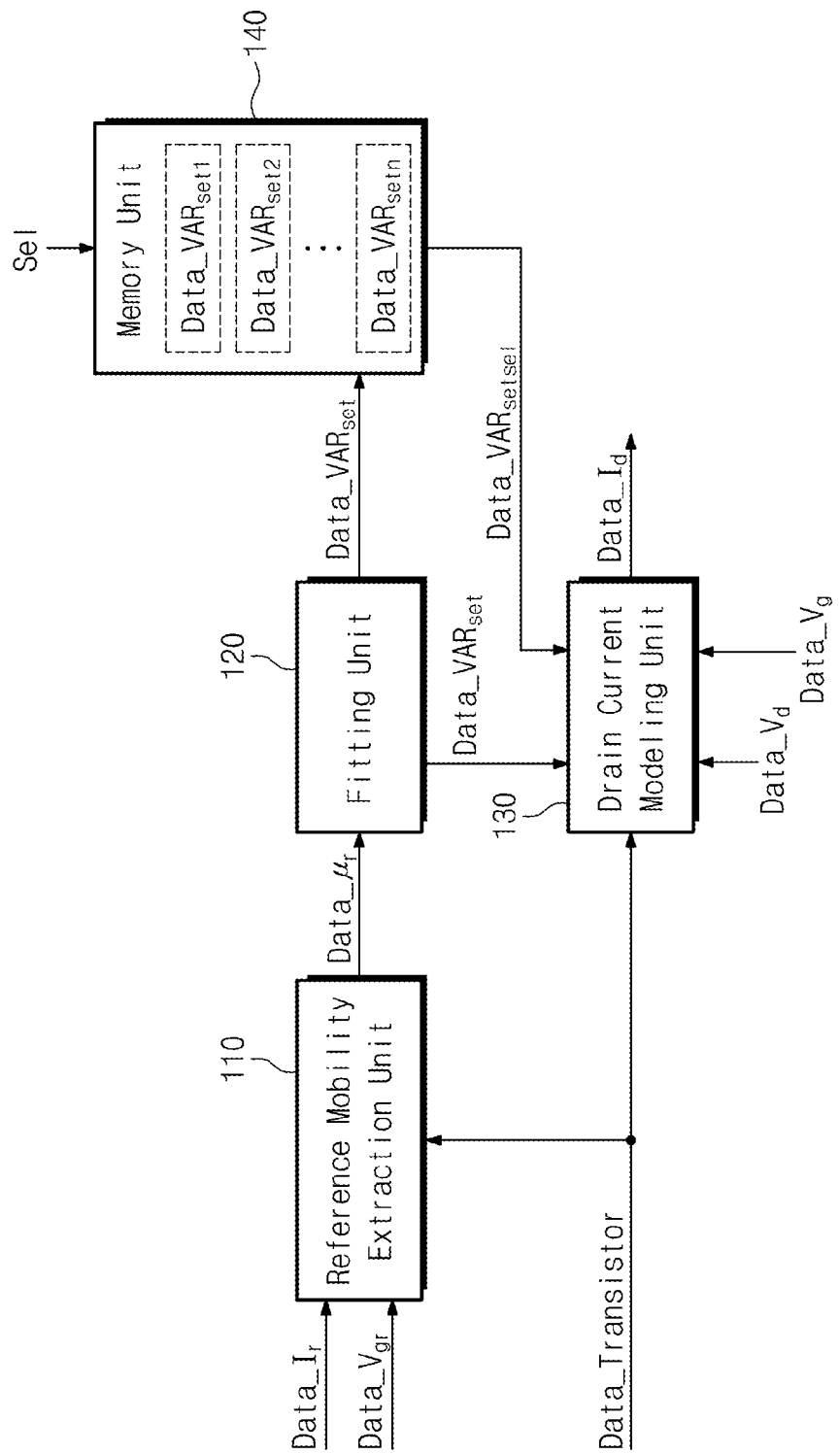
FIG. 3 is a block diagram illustrating an apparatus used in modeling a transistor according to a modified embodiment.

A modeling apparatus of a transistor according to a modified embodiment will be described hereinafter. FIG. 3 is a block diagram illustrating an apparatus used in modeling a transistor according to a modified embodiment. The modeling apparatus according to the present modified embodiment may be similar to the modeling apparatus according to the previous embodiment illustrated in FIG. 2. Thus, the following description will focus on differences between the present modified embodiment and the previously described embodiment of FIG. 2.

Referring to FIG. 3, a modeling apparatus according to the present modified embodiment may include a reference mobility extraction unit 110, a fitting unit 120, a drain current modeling unit 130 and a memory unit 140. The reference mobility extraction unit 110, the fitting unit 120 and the drain current modeling unit 130 may have the same configurations as those described with reference to FIG. 2.

A modeled drain current of a first transistor may be obtained using the reference mobility extraction unit 110, the fitting unit 120 and the drain current modeling unit 130. That is, the modeled drain current of the first transistor may be obtained using the same manners as described with reference to FIGS. 1 and 2. A channel layer (hereinafter, referred to as a first channel layer) of the first transistor may be formed of a first material. A first model parameter data set (Data_VARset1) of the first transistor may be transmitted to the memory unit 140 and may be stored therein.

Subsequently, a modeled drain current of a second transistor may be obtained using the reference mobility extraction unit 110, the fitting unit 120 and the drain current modeling unit 130. That is, the modeled drain current of the second transistor may be also obtained using the same manners as described with reference to FIGS. 1 and 2. A channel layer (hereinafter, referred to as a second channel layer) of the second transistor may be formed of a second material different from the first material. A second model parameter data set (Data_VARset2) of the second transistor may be transmitted to the memory unit 140 and may be stored therein.

The above processes may be repeatedly performed to obtain a plurality of model parameter data sets, and the plurality of model parameter data sets may be stored in the memory unit 140. That is, "n"-number of model parameter data sets (Data_VARset1~Data_VARsetn,) of "n"-number of different transistors may be stored in the memory unit 140 ("n" is a natural number equal to or greater than two).

The memory unit 140 may receive a selection signal Sel, and the memory unit 140 may transmit any one the model parameter data set (Data_VARsetsel) selected from the group consisting of the plurality of model parameter data sets (Data_VARset1~Data_VARsetn) to the drain current modeling unit 130 in response to the selection signal Sel. The drain current modeling unit 130 may produce a drain current data (Data_Id) of the corresponding transistor using the selected model parameter data set (Data_VARsetsel).

Various simulation results of the drain current obtained according to the embodiments will be described hereinafter.

Figure 4:
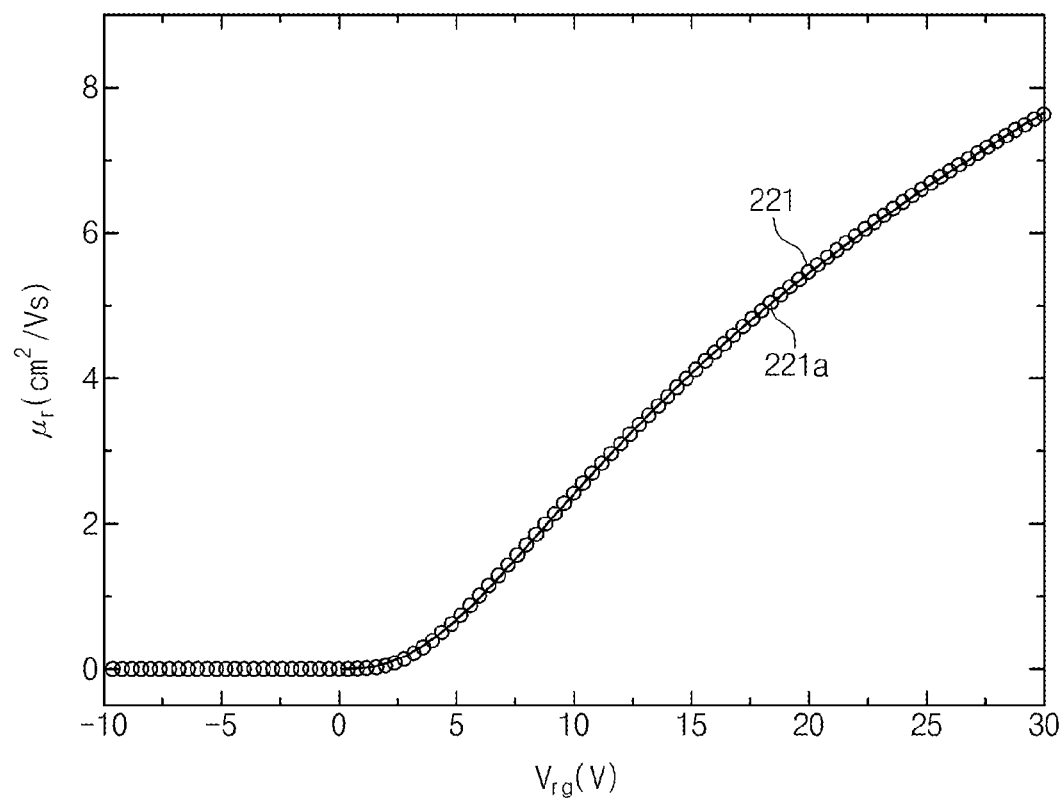
FIG. 4 is a graph illustrating a mobility characteristic of a transistor having an indium-gallium-zinc oxide (IGZO) channel layer obtained by fitting a mobility function on reference mobility values using a modeling method according to an embodiment.
Figure 5:
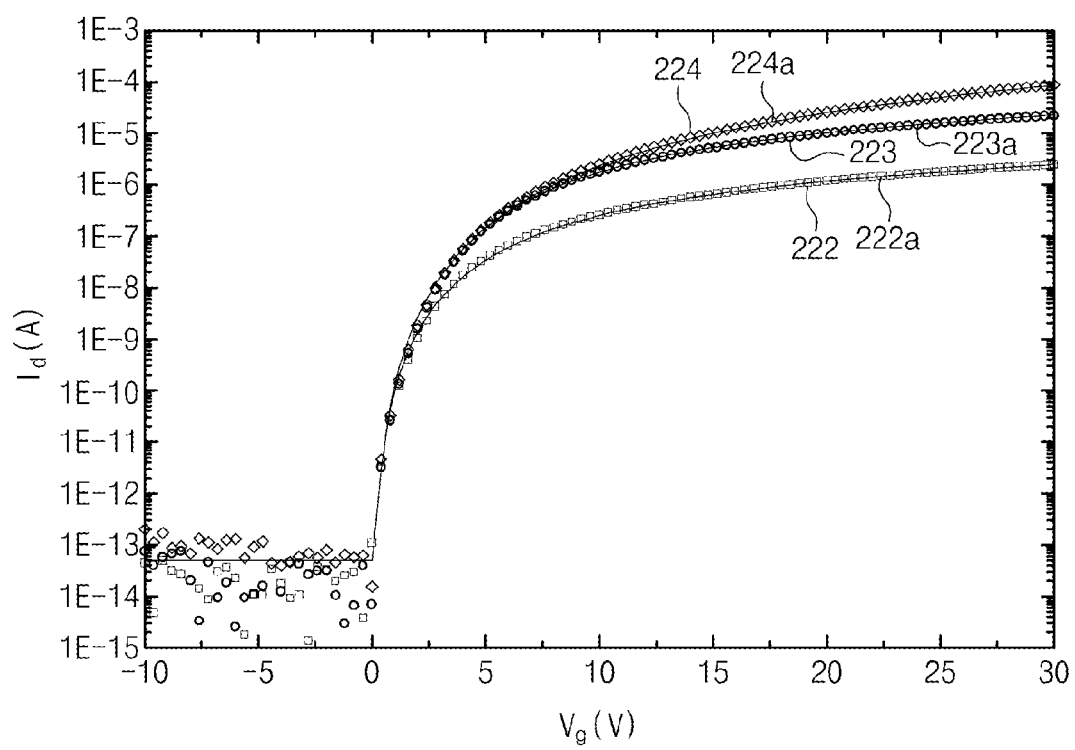
FIG. 5 is a graph illustrating modeled transfer curves obtained using a modeling method according to an embodiment together with actually measured transfer curves, in conjunction with a transistor having an IGZO channel layer.
Figure 6:
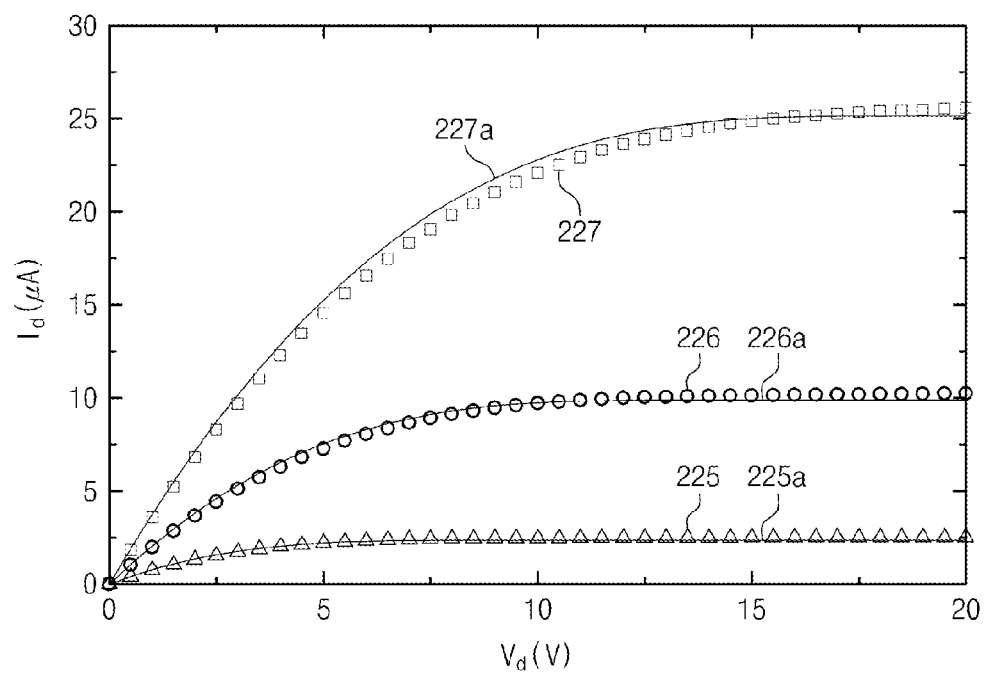
FIG. 6 is a graph illustrating modeled Id-Vd curves obtained using a modeling method according to an embodiment together with actually measured Id-Vd curves, in conjunction with a transistor having an IGZO channel layer.

FIG. 4 is a graph illustrating a mobility characteristic of a transistor having an indium-gallium-zinc oxide (IGZO) channel layer obtained by fitting a mobility function on reference mobility values using a modeling method according to an embodiment. FIG. 5 is a graph illustrating modeled transfer curves obtained using a modeling method according to an embodiment together with actually measured transfer curves, in conjunction with a transistor having an IGZO channel layer. FIG. 6 is a graph illustrating modeled Id-Vd curves obtained using a modeling method according to an embodiment together with actually measured Id-Vd curves, in conjunction with a transistor having an IGZO channel layer.

Referring to FIG. 4, the abscissa denotes a reference gate voltage Vrg, and the ordinate denotes a reference mobility $\mu_r$ of a channel layer of a transistor. In FIG. 4, data indicated by reference numeral 221 correspond to reference mobility values of an IGZO channel layer relative to the reference gate voltage Vrg, which are extracted using the equation 1 described with reference to the steps S10 and S20 of FIG. 1. Further, data indicated by reference designator 221a correspond to a mobility curve fitted on the reference mobility values relative to the reference gate voltage Vrg, which is obtained using the equation 2 described with reference to the steps S30 of FIG. 1. Model parameters extracted from the mobility curve 221a of FIG. 4 were listed in the following table 1.

TABLE 1

| Material of Channel layer | Ka | Kb | α | β |
|---|---|---|---|---|
| IGZO | 0.978 | 0.01098 | 0.626 | 2.71 |

Referring to FIG. 5, the abscissa denotes an arbitrary gate voltage Vg applied to the gate electrode of the transistor, and the ordinate denotes a drain current Id flowing through the channel layer between the drain region and the source region of the transistor. Transfer curves indicated by reference numerals 222, 223 and 224 represent drain current data that are actually measured according to the gate voltage Vg. The transfer curves 222, 223 and 224 were measured at drain voltages of about 0.3 Volts, about 3 Volts and about 30 Volts, respectively. Further, transfer curves indicated by reference designators 222a, 223a and 224a correspond to modeled transfer curves of the transistor obtained by putting the model parameters "Ka", "Kb", "α" and "β" extracted from the mobility curve 221a of FIG. 4 into the equation 3 described with reference to the step S40 of FIG. 1. The modeled transfer curves 222a, 223a and 224a were obtained at the drain voltages of about 0.3 Volts, about 3 Volts and about 30 Volts, respectively.

Referring to FIG. 6, the abscissa denotes an arbitrary drain voltage Vd applied to the drain region of the transistor, and the ordinate denotes a drain current Id flowing through the channel layer between the drain region and the source region of the transistor. Id vs. Vd (Id-Vd) curves indicated by reference numerals 225, 226 and 227 represent drain current data that are actually measured according to the drain voltage Vd. The Id-Vd curves 225, 226 and 227 were measured at gate voltages of about 10 Volts, about 15 Volts and about 20 Volts, respectively. Further, Id-Vd curves indicated by reference designators 225a, 226a and 227a correspond to modeled Id-Vd curves of the transistor obtained by putting the model parameters "Ka", "Kb", "α" and "β" extracted from the mobility curve 221a of FIG. 4 into the equation 3 described with reference to the step S40 of FIG. 1. The modeled Id-Vd curves 225a, 226a and 227a were obtained at the gate voltages of about 10 Volts, about 15 Volts and about 20 Volts, respectively.

As can be seen from FIGS. 5 and 6, the transfer curves and the Id-Vd curves of the modeled transistor having the IGZO channel layer according to the embodiment were almost consistent with the measured transfer curves and the measured Id-Vd curves, respectively.

Figure 7:
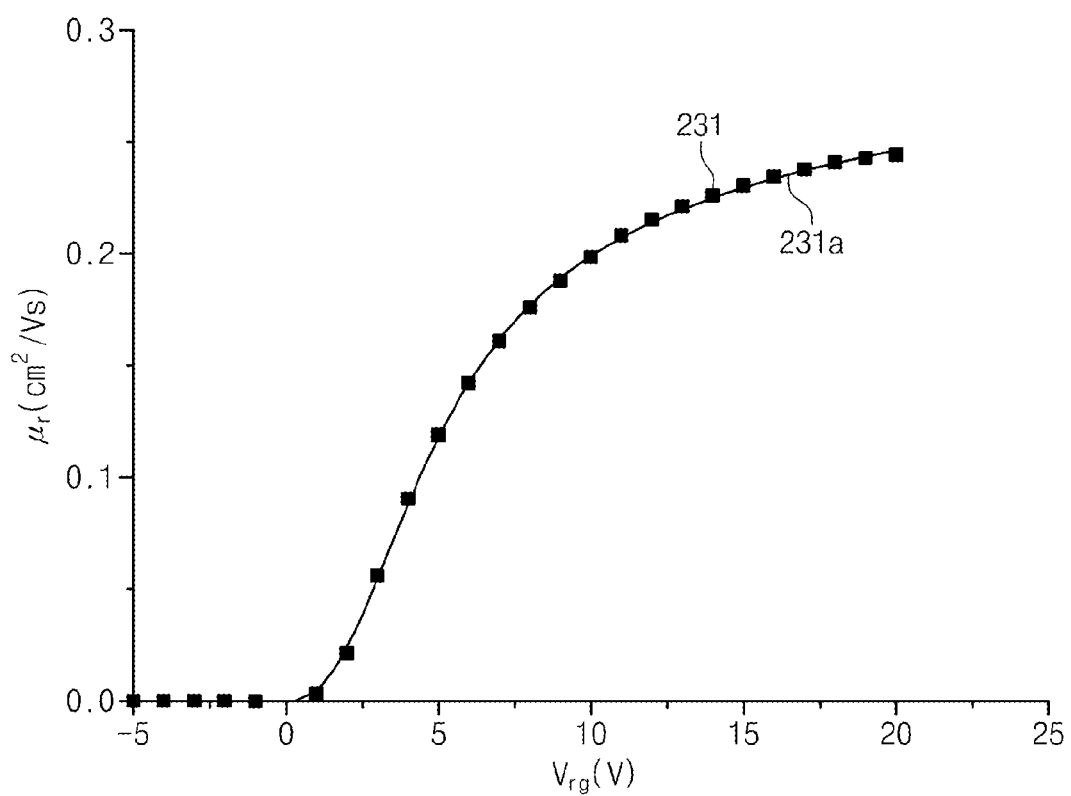
FIG. 7 is a graph illustrating a mobility characteristic of a transistor having an amorphous silicon channel layer obtained by fitting a mobility function on reference mobility values using a modeling method according to an embodiment.
Figure 8:
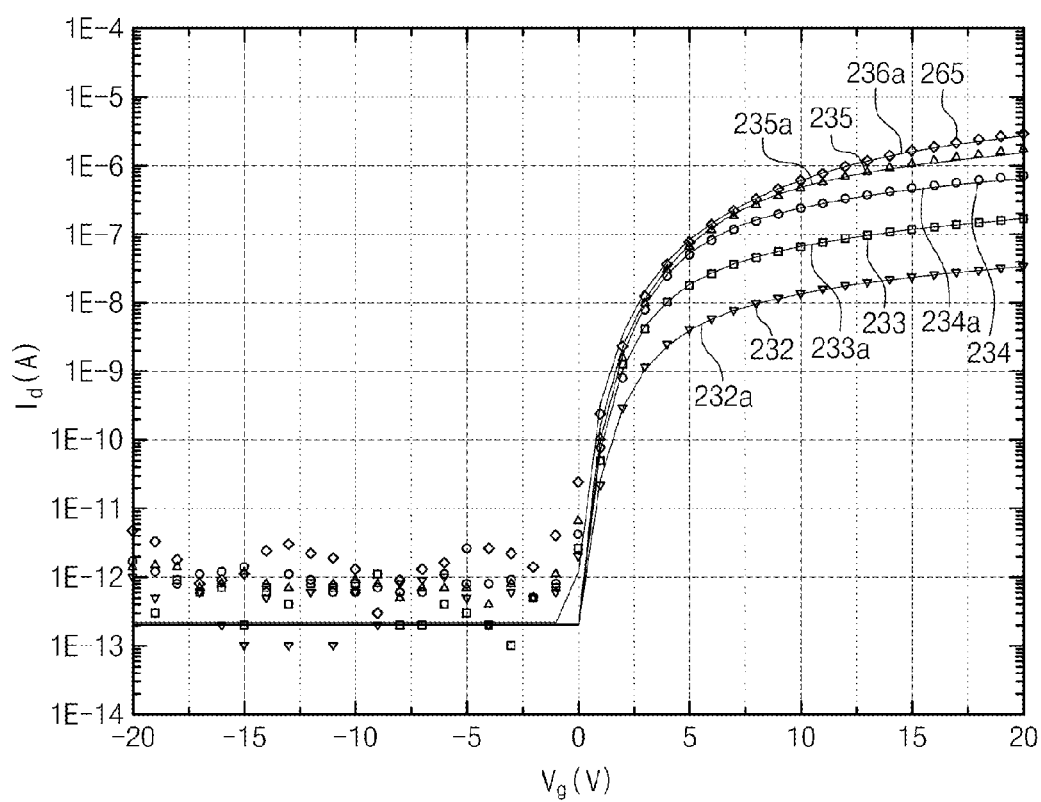
FIG. 8 is a graph illustrating modeled transfer curves obtained using a modeling method according to an embodiment together with actually measured transfer curves, in conjunction with a transistor having an amorphous silicon channel layer.

FIG. 7 is a graph illustrating a mobility characteristic of a transistor having an amorphous silicon channel layer obtained by fitting a mobility function on reference mobility values using a modeling method according to an embodiment. FIG. 8 is a graph illustrating modeled transfer curves obtained using a modeling method according to an embodiment together with actually measured transfer curves, in conjunction with a transistor having an amorphous silicon channel layer. FIG. 6 is a graph illustrating modeled Id-Vd curves obtained using a modeling method according to an embodiment together with actually measured Id-Vd curves, in conjunction with a transistor having an amorphous silicon channel layer.

Referring to FIG. 7, the abscissa denotes a reference gate voltage Vrg, and the ordinate denotes a reference mobility $\mu_r$ of a channel layer of a transistor. In FIG. 7, data indicated by reference numeral 231 correspond to reference mobility values of an amorphous silicon channel layer relative to the reference gate voltage Vrg, which are extracted using the equation 1 described with reference to the steps S10 and S20 of FIG. 1. Further, data indicated by reference designator 231a correspond to a mobility curve fitted on the reference mobility values relative to the reference gate voltage Vrg, which is obtained using the equation 2 described with reference to the steps S30 of FIG. 1. Model parameters extracted from the mobility curve 231a of FIG. 7 were listed in the following table 2.

TABLE 2

| Material of Channel layer | Ka | Kb | α | β |
|---|---|---|---|---|
| Amorphous Silicon | 0.157 | 0.00476 | 0.150 | 2.54 |

Referring to FIG. 8, the abscissa denotes an arbitrary gate voltage Vg applied to the gate electrode of the transistor, and the ordinate denotes a drain current Id flowing through the channel layer between the drain region and the source region of the transistor. Transfer curves indicated by reference numerals 232, 233, 234, 235 and 236 represent drain current data that are actually measured according to the gate voltage Vg. The transfer curves 232, 233, 234, 235 and 236 were measured at drain voltages of about 0.1 Volts, about 0.5 Volts, about 2 Volts, about 5 Volts and about 10 Volts, respectively. Further, transfer curves indicated by reference designators 232a, 233a, 234a, 235a and 236a correspond to modeled transfer curves of the transistor obtained by putting the model parameters "Ka", "Kb", "α" and "β" extracted from the mobility curve 231a of FIG. 7 into the equation 3 described with reference to the step S40 of FIG. 1. The modeled transfer curves 232a, 233a, 234a, 235a and 236a were obtained at the drain voltages of about 0.1 Volts, about 0.5 Volts, about 2 Volts, about 5 Volts and about 10 Volts, respectively.

Figure 9:
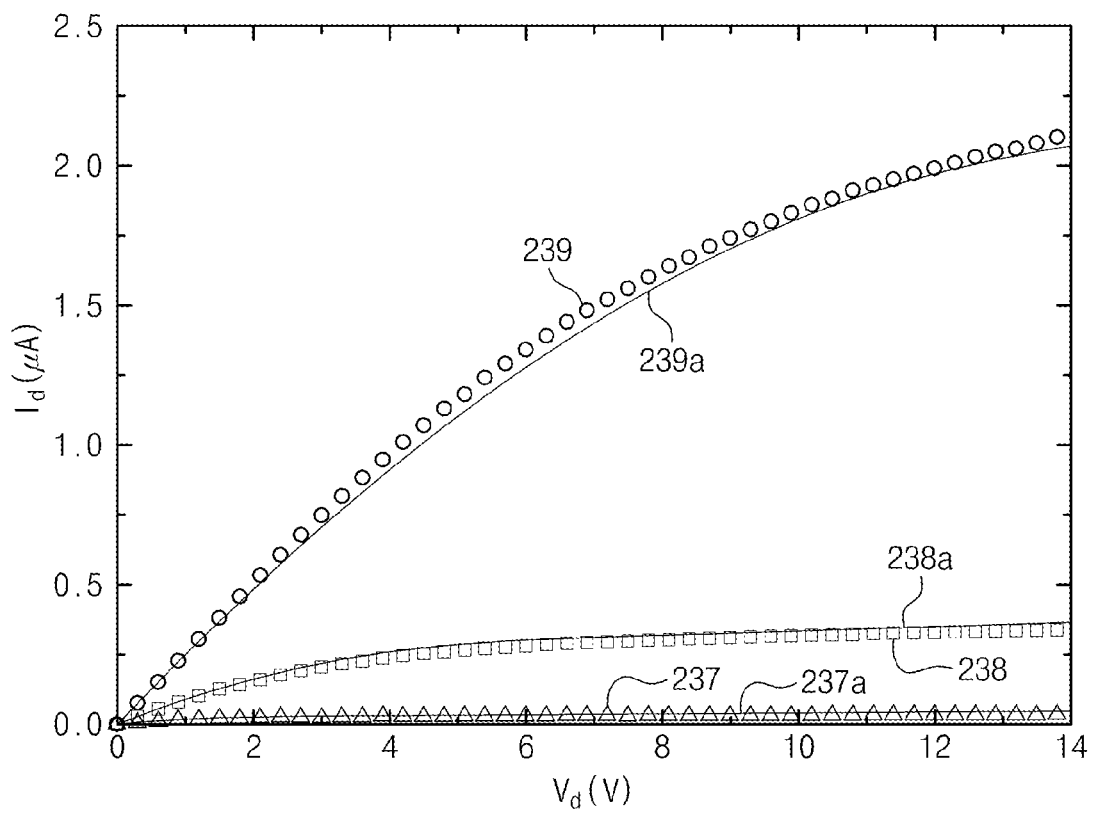
FIG. 9 is a graph illustrating modeled Id-Vd curves obtained using a modeling method according to an embodiment together with actually measured Id-Vd curves, in conjunction with a transistor having an amorphous silicon channel layer.

Referring to FIG. 9, the abscissa denotes an arbitrary drain voltage Vd applied to the drain region of the transistor, and the ordinate denotes a drain current Id flowing through the channel layer between the drain region and the source region of the transistor. Id vs. Vd (Id-Vd) curves indicated by reference numerals 237, 238 and 239 represent drain current data that are actually measured according to the drain voltage Vd. The Id-Vd curves 237, 238 and 239 were measured at gate voltages of about 4 Volts, about 8 Volts and about 16 Volts, respectively. Further, Id-Vd curves indicated by reference designators 237a, 238a and 239a correspond to modeled Id-Vd curves of the transistor obtained by putting the model parameters "Ka", "Kb", "α" and "β" extracted from the mobility curve 231a of FIG. 7 into the equation 3 described with reference to the step S40 of FIG. 1. The modeled Id-Vd curves 237a, 238a and 239a were obtained at the gate voltages of about 4 Volts, about 8 Volts and about 16 Volts, respectively.

As can be seen from FIGS. 8 and 9, the transfer curves and the Id-Vd curves of the modeled transistor having the amorphous silicon channel layer according to the embodiment were almost consistent with the measured transfer curves and the measured Id-Vd curves, respectively.

According to the embodiments set forth above, a mobility function may be fitted on reference mobility values of a channel layer extracted using reference gate voltage values and reference drain current values, thereby extracting model parameters. The model parameters can be put into a drain current modeling function to calculate drain currents of the modeled transistor. Accordingly, high reliable and simple modeling methods of transistors can be provided.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A method of modeling a transistor, the method comprising performing, by an apparatus including a memory unit, the steps of:
    extracting reference mobility values of a channel layer of a transistor including a gate electrode, a source region and a drain region using a reference gate voltage, a reference drain current and a reference drain voltage;
    fitting a mobility function including model parameters on the reference mobility values to extract the model parameters; and
    putting the extracted model parameters into a drain current modeling function to calculate a drain current flowing through the channel layer between the drain region and the source region under a bias condition defined by an arbitrary gate voltage applied to the gate electrode and an arbitrary drain voltage applied to the drain region;
    wherein the mobility function is expressed by the following equation, $$\mu = \left( \frac{1}{K_b(V_{gate} - V_{on})^\beta} + \frac{1}{K_a(V_{gate} - V_{on})^\alpha} \right)^{-1}$$

wherein, "Ka", "Kb", "α" and "β" denote the model parameters, "Vgate" denotes the reference gate voltage applied to the gate electrode, "Von" denotes a turn on voltage of the transistor, and "μ" denotes a mobility of the channel layer calculated using the model parameters, the reference gate voltage and the turn on voltage.

2. The method of claim 1, wherein the drain current modeling function is expressed by the following equation, $$I_d = \frac{CW}{L} \int_0^{V_d} \left( \frac{1}{K_b(V_g - V_{on} - V_y)^\beta} + \frac{1}{K_a(V_g - V_{on} - V_y)^\alpha} \right)^{-1} \times (V_g - V_{on} - V_y) dV_y$$

wherein, "Id" denotes the drain current, "Vg" denotes the arbitrary gate voltage, "Vd" denotes the arbitrary drain voltage, "L" denotes a channel length of the transistor, "W" denotes a channel width of the transistor, and "C" denotes a gate capacitance between the channel layer and the gate electrode.

3. The method of claim 2, further comprising:
    additionally and repeatedly performing the step of extracting the reference mobility values and the step of extracting the model parameters against different channel layers at least once to extract a plurality of model parameter data sets; and
    storing a memory unit with the plurality of model parameter data sets.

4. The method of claim 3, further comprising selecting one set of the plurality of model parameter data sets,
    wherein the drain current is calculated using the selected of model parameter data set.

5. The method of claim 1, wherein the reference mobility values are extracted using the following equation, $$\mu_r = \frac{L}{W} \frac{I_r}{C(V_{gr} - V_{on})V_{dr}}$$

wherein, "$\mu_r$" denotes the reference mobility, "L" denotes a channel length of the transistor, "W" denotes a channel width of the transistor, "Ir" denotes the reference drain current, "C" denotes a gate capacitance between the channel layer and the gate electrode, "Vgr" denotes the reference gate voltage, "Von" denotes a turn on voltage of the transistor, and "Vdr" denotes the reference drain voltage.

6. The method of claim 5, wherein the reference drain voltage is within the range of about 0.001 Volts to about 1.0 Volts.

7. The method of claim 1, further comprising applying the reference gate voltage and the reference drain voltage to the gate electrode and the drain region respectively to measure the reference drain current flowing through the channel layer between the drain region and the source region, prior to extraction of the reference mobility values.

8. The method of claim 1, wherein the transistor includes a thin film transistor.

9. The method of claim 1, wherein the channel layer has an amorphous structure.

10. The method of claim 1, wherein the channel layer includes an organic semiconductor material or an oxide semiconductor material.

11. An apparatus used in modeling a transistor, the apparatus comprising:
    a reference mobility extraction unit for extracting reference mobility values of a channel layer of the transistor including a gate electrode, a source region and a drain region using a reference gate voltage applied to the gate electrode and a reference drain current flowing through the channel layer in response to the reference gate voltage;
    a fitting unit for extracting model parameters by fitting a mobility function of the model parameters on the reference mobility values; and
    a drain current modeling unit for calculating a drain current flowing through the channel layer by putting an arbitrary gate voltage applied to the gate electrode, an arbitrary drain voltage applied to the drain region and the model parameters into a drain current modeling function.

12. The apparatus of claim 11, wherein the drain current modeling unit additionally puts a channel length of the transistor, a channel width of the transistor, a gate capacitance between the channel layer and the gate electrode, an arbitrary drain voltage applied to the drain region, and a turn on voltage of the transistor into the drain current modeling function.

13. An apparatus used in modeling a transistor, the apparatus comprising:

a reference mobility extraction unit for extracting reference mobility values of a channel layer of the transistor including a gate electrode, a source region and a drain region using a reference gate voltage applied to the gate electrode and a reference drain current flowing through the channel layer in response to the reference gate voltage;

a fitting unit for extracting model parameters by fitting a mobility function of the model parameters on the reference mobility values; and a drain current modeling unit for calculating a drain current flowing through the channel layer by putting an arbitrary gate voltage applied to the gate electrode, an arbitrary drain voltage applied to the drain region and the model parameters into a drain current modeling function;

wherein the drain current modeling unit additionally puts a channel length of the transistor, a channel width of the transistor, a gate capacitance between the channel layer and the gate electrode, an arbitrary drain voltage applied to the drain region, and a turn on voltage of the transistor into the drain current modeling function, wherein the fitting unit extracts the model parameters by fitting a mobility function on the reference mobility values, wherein the mobility function is expressed by the following equation, $$\mu = \left( \frac{1}{K_b(V_{gate} - V_{on})^\beta} + \frac{1}{K_a(V_{gate} - V_{on})^\alpha} \right)^{-1}$$

wherein, "Ka", "Kb", "α" and "β" denote the model parameters, "Vgate" denotes the reference gate voltage corresponding to a gate voltage applied to the gate electrode, "Von" denotes a turn on voltage of the transistor, and "μ" denotes a mobility of the channel layer that is calculated using the model parameters, the reference gate voltage and the turn on voltage, and wherein the drain current modeling function is expressed by the following equation, $$I_d = \frac{CW}{L} \int_0^{V_d} \left( \frac{1}{K_b(V_g - V_{on} - V_y)^\beta} + \frac{1}{K_a(V_g - V_{on} - V_y)^\alpha} \right)^{-1} \times (V_g - V_{on} - V_y) dV_y$$

wherein, "Id" denotes the drain current, "Vg" denotes the arbitrary gate voltage, "Vd" denotes the arbitrary drain voltage, "L" denotes a channel length of the transistor, "W" denotes a channel width of the transistor, "C" denotes a gate capacitance between the channel layer and the gate electrode, and "Von" denotes the turn on voltage of the transistor.

14. The apparatus of claim 13:

wherein the number of the transistor is two or more, wherein the channel layers of the plurality of transistors are formed of different material layers from each other, and wherein the reference mobility extraction unit and the fitting unit extract a plurality of model parameter sets including the model parameters.

15. The apparatus of claim 14, further comprising a memory unit storing the plurality of model parameter sets therein.

* * * * *